United States Patent
Doi

(10) Patent No.: US 7,804,092 B2
(45) Date of Patent: Sep. 28, 2010

(54) ACTIVE-MATRIX-DRIVE DISPLAY UNIT INCLUDING TFT

(75) Inventor: Satoshi Doi, Kanagawa (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 12/170,067

(22) Filed: Jul. 9, 2008

(65) Prior Publication Data

US 2009/0014722 A1    Jan. 15, 2009

(30) Foreign Application Priority Data

Jul. 9, 2007    (JP) .............................. 2007-180043

(51) Int. Cl.
*H01L 29/04*    (2006.01)
*H01L 29/10*    (2006.01)

(52) U.S. Cl. .......................... 257/59; 257/72; 257/350; 257/E29.151

(58) Field of Classification Search .................. 257/59, 257/72, 350, E29.151
See application file for complete search history.

(56) References Cited

U.S. PATENT DOCUMENTS

| | | | |
|---|---|---|---|
| 6,395,571 B1 * | 5/2002 | Yi et al. | 438/30 |
| 6,472,684 B1 * | 10/2002 | Yamazaki et al. | 257/72 |
| 6,501,132 B1 * | 12/2002 | Ohtani | 257/347 |
| 6,773,944 B2 * | 8/2004 | Okamoto | 438/30 |
| 7,312,498 B2 * | 12/2007 | Ozawa | 257/317 |
| 7,422,984 B2 * | 9/2008 | Okamoto | 438/720 |
| 2001/0011726 A1 * | 8/2001 | Hayashi et al. | 257/59 |
| 2001/0020994 A1 * | 9/2001 | Kaneko et al. | 349/147 |
| 2002/0025591 A1 * | 2/2002 | Ohnuma et al. | 438/30 |
| 2003/0100151 A1 * | 5/2003 | Okamoto | 438/163 |
| 2005/0012151 A1 * | 1/2005 | Yamaguchi et al. | 257/347 |
| 2005/0042785 A1 * | 2/2005 | Okamoto | 438/30 |
| 2005/0145925 A1 * | 7/2005 | Ozawa | 257/315 |
| 2006/0114736 A1 * | 6/2006 | Ozawa | 365/222 |
| 2006/0246620 A1 * | 11/2006 | Nagayama et al. | 438/99 |
| 2006/0246633 A1 * | 11/2006 | Arai et al. | 438/149 |
| 2006/0267097 A1 * | 11/2006 | Codama | 257/347 |
| 2007/0296003 A1 * | 12/2007 | Park et al. | 257/288 |
| 2008/0119024 A1 * | 5/2008 | Ohnuma et al. | 438/283 |
| 2008/0286914 A1 * | 11/2008 | Makimura et al. | 438/166 |
| 2009/0004872 A1 * | 1/2009 | Okamoto | 438/720 |

FOREIGN PATENT DOCUMENTS

| | | |
|---|---|---|
| JP | 11-002843 A | 1/1999 |
| JP | 2000-171834 A | 6/2000 |

* cited by examiner

*Primary Examiner*—Ngan Ngo
(74) *Attorney, Agent, or Firm*—Sughrue Mion, PLLC

(57) ABSTRACT

An active-matrix-drive LCD includes a TFT substrate, on which a TFT is formed. The TFT includes a gate electrode layer, a gate insulating film, a patterned semiconductor layer, and a source/drain electrode layer, which are consecutively formed on an insulating substrate of the TFT substrate. The gate electrode layer has a thickness smaller than a thickness of the gate insulating film.

5 Claims, 7 Drawing Sheets

ACTIVE-MATRIX-DRIVE DISPLAY UNIT INCLUDING TFT

This application is based upon and claims the benefit of priority from Japanese patent application No. 2007-180043, filed on Jul. 9, 2007 the disclosure of which is incorporated herein in its entirety by reference.

TECHNICAL FIELD

The present invention relates to an active-matrix-drive display unit including a TFT (thin film transistor) and, more particularly, to the structure of a TFT used in an active-matrix-drive display unit such as a liquid crystal display (LCD) unit.

BACKGROUND OF RELATED ART

An LCD unit includes a thin-film-transistor (TFT) substrate and a counter substrate sandwiching therebetween a liquid crystal (LC) layer. The TFT substrate mounts thereon an array of TFTs corresponding to an array of pixels in the LCD unit. The TFTs are driven separately from one another via a plurality of gate lines and a plurality of drain lines (data lines) by using a drive LSI. The each TFT functions as a switching device to control the electric field applied to the LC layer, in a pixel-by-pixel basis, for displaying an image on the screen of the LCD unit.

The TFT substrate is a transparent substrate or a glass substrate, on which the array of TFTs are formed. Each TFT includes a gate electrode formed on the glass substrate, an intrinsic semiconductor layer formed on the gate electrode with an intervention of a gate insulating film, and source and drain electrodes electrically connected to the intrinsic semiconductor layer on both ends of the channel region thereof. The gate electrode is configured as a part of a gate electrode layer, whereas the source and drain electrodes are configured as a part of a source/drain electrode layer. The intrinsic semiconductor layer is configured by a hydrogenated amorphous silicon (a-Si:H) etc.

The structure of the TFT substrate in the LCD unit is described in, for example, the following publications:

Patent Publication 1; JP-2000-171834A; and
Patent Publication 2; JP-1999-2843A.

Along with the recent development of a higher performance of the LCD unit, it is desired that the TFT has a higher ON/OFF ratio of the drain current in order to improve the data writing characteristic of the TFT. The higher ON/OFF ratio of the drain current may be obtained by a smaller thickness of the gate insulating film to thereby increase the ON current of the TFT.

However, there is a tendency that a thickness of the gate insulating film is too thin, under a specific thickness of the film, to cause a significant increase in the OFF current of the TFT and which may incur a poor image quality, such as non-uniformity of the screen image and point defects on the screen of the LCD unit. The thickness of the gate insulating film has reached almost the lower limit of thickness, the OFF current significantly increases and as a result, the ON/OFF ratio of the drain current goes down. Thus, it is difficult to further reduce the thickness of the gate insulating film without increasing the OFF current of the TFT.

SUMMARY OF THE INVENTION

In view of the above problem in the display unit such as an LCD unit, it is an object of the present invention to provide an active-matrix-drive display unit which is capable of achieving an higher ON/OFF ratio of the drain current, to thereby improve the image quality of the display unit.

The present invention provides an active-matrix-drive display unit including: a thin film transistor including a gate electrode layer, a gate insulating film, a patterned semiconductor layer, and a source/drain electrode layer, which are configured in association with one another on an insulating substrate, the gate insulating film having a smaller thickness than that of the gate electrode layer.

The above and other objects, features and advantages of the present invention will be more apparent from the following description, referring to the accompanying drawings.

EXEMPLARY EMBODIMENT

Figure 1:
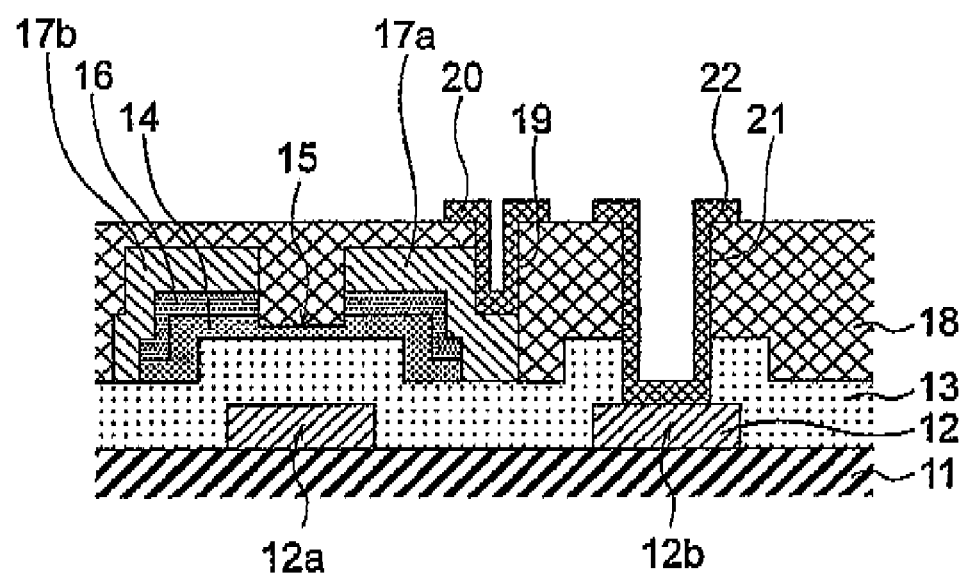
FIG. 1 is a sectional view of a TFT substrate in an LCD unit according to an embodiment of the present invention.

Now, an exemplary embodiment of the present invention will be described with reference to accompanying drawings. FIG. 1 shows a sectional view of a TFT substrate used in a display unit according to an embodiment of the present invention. The TFT substrate 10 includes a glass substrate 11, and a gate electrode layer 12 formed on the glass substrate 11.

The gate electrode layer 12 includes an aluminum (Al) film having a thickness of 300 nm, and a molybdenum (Mo) film formed on the Al film and having a thickness of 70 nm, for example. The gate electrode layer 12 is configured as gate electrodes 12a, gate electrode terminals 12b, and gate lines (not shown) for connecting together the gate electrodes 12a and gate electrode terminals 12b, and common lines (not shown).

The gate electrode layer 12 is covered by a SiNx (nitride silicon) gate insulating film 13 formed on the glass substrate 11. In the present embodiment, the thickness of the gate insulating film 13 is thinner than the thickness of the gate electrode layer 12, and may be 300 nm (nanometer), for example. The gate insulating film 13 may have a two-layer structure such as SiNx/SiOx (oxide silicon), instead of SiNx.

A portion of the gate insulating film 13 near the gate electrode 12a is overlaid by an intrinsic semiconductor layer 14, which is configured by a hydrogenated amorphous silicon (a-Si:H). A portion of the intrinsic semiconductor layer 14 on the gate electrode 12a configures a channel 15. Except for the channel 15, the intrinsic semiconductor layer 14 is overlaid by an ohmic contact layer 16 configured by hydrogenated amorphous silicon doped with n-type impurities ($n^+$a-Si:H).

The ohmic contact layer 16 is overlaid by the source/drain electrode layer including single chromium (Cr) film or Mo/AL/Mo integrated films formed on the gate insulating film 13. The source/drain electrode layer is configured as source electrodes 17a and drain electrodes 17b, which are connected to the ohmic contact layer 16 at both the ends of the channel 15, and drain lines and drain electrode terminals which are formed on the gate insulating film 13. The drain lines (interconnection lines) connect together the drain electrodes 17b and the drain electrode terminals. A protective layer 18 including SiNx covers the entire area of the insulating substrate 11 including the channel 15. A combination of the gate electrode 12, gate insulating film 13, source electrode 17a, drain electrode 17b, a pair of ohmic contact layers 16, and intrinsic semiconductor (Si) layer 14 including channel 15 configures a TFT.

Contact holes 19 penetrate the protective layer 18 to expose therethrough the source electrode 17a and drain electrode terminal. A pixel electrode 20 is formed within the contact hole 19 and on top of the protective layer 18, and connected to the source electrode 17a. A contact hole 21 penetrates the gate insulating film 13 and protective layer 18 to expose therethrough top of the gate electrode terminal 12b and drain electrode terminal. An external electrode 22 is formed within the contact hole 21 and on top of the protective layer 18 to connect to the gate electrode terminal 12b or drain electrode terminal. The pixel electrode 20 and external electrode 22 include ITO (indium-tin-oxide) or IZO (indium-zinc-oxide).

Figure 2:
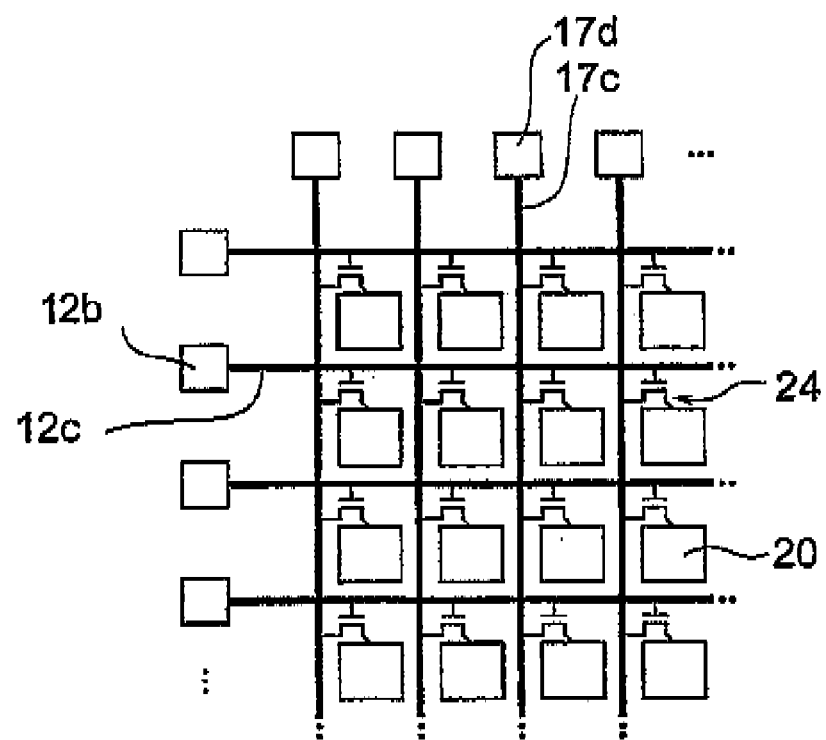
FIG. 2 is a schematic top plan view of the TFT substrate of FIG. 1.

FIG. 2 is a schematic top plan view of The TFT substrate 10. The LCD unit of the present embodiment is driven by an active-matrix-drive drive scheme, and the pixel electrodes 20 are arranged in a two-dimensional matrix on the TFT substrate 10. The area in which a pixel electrode 20 is formed corresponds to a pixel. Each pixel electrode 20 is associated with a TFT 24 including the gate electrode 12a, source electrode 17a, and drain electrode 17b. The gate lines 12c extend between adjacent two of the pixel electrodes 20 in the row direction, whereas the drain lines 17c extend between adjacent two of the pixel electrodes 20 in the column direction. The gate electrode terminals 12b are disposed at the end of the gate lines 12c, and the drain electrode terminals are disposed at the end of the drain lines 17c.

In the LCD unit 10, a counter substrate is disposed to oppose the TFT substrate 10, with an intervention of a liquid crystal (LC) layer. In the TFT substrate 10, a voltage applied to the pixel electrode 20 via the drain lines 17c controls the electric field in a corresponding portion of the LC layer. The electric filed controls the orientation of the LC molecules in the LC layer to control the intensity of a transmitted light from a backlight resource in a pixel-by-pixel basis, for displaying the image on the LCD.

Figure 3A:
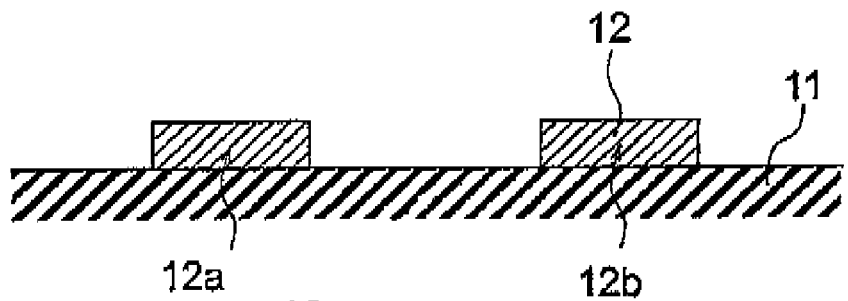
FIGS. 3A to 3F are sectional views consecutively showing steps of a fabrication process for manufacturing the TFT substrate of FIG. 1.

FIGS. 3A to 3F are sectional views consecutively showing steps of a fabrication process for manufacturing the TFT substrate 10 of FIG. 1. First, a metallic layer including Mo/Al films is formed on the glass substrate 11 by using a sputtering technique. The thickness of Al film and Mo film is 300 nm and 70 nm, respectively. A single Cr film may be formed as the metallic layer instead. Subsequently, the metallic layer is subjected to patterning using a wet etching process, to thereby form the gate electrode layer 12 (FIG. 3A). The wet etching process as used for patterning the metallic layer has the advantage over the dry etching process in that the initial cost for the wet etching apparatus is lower and the wet etching process achieves a higher throughput.

Thereafter, the gate insulating film 13 including SiNx, intrinsic semiconductor layer 14 including a-Si:H, and ohmic contact layer 16 including $n^+$a-Si:H are consecutively deposited to cover the gate electrode layer 12 on the glass substrate 11 by using a plasma-enhanced CVD process. The thickness of the gate insulating film 13 may be 300 nm. A step portion 23 is formed on the surface of the gate insulating film 13 to reflect the pattern of the gate electrode layer 12 in the vicinity of the pattern of gate electrode layer 12 after depositing the gate insulating film 13. A SiNx/SiOx film may be used as the gate insulating film 13 instead.

Figure 3B:
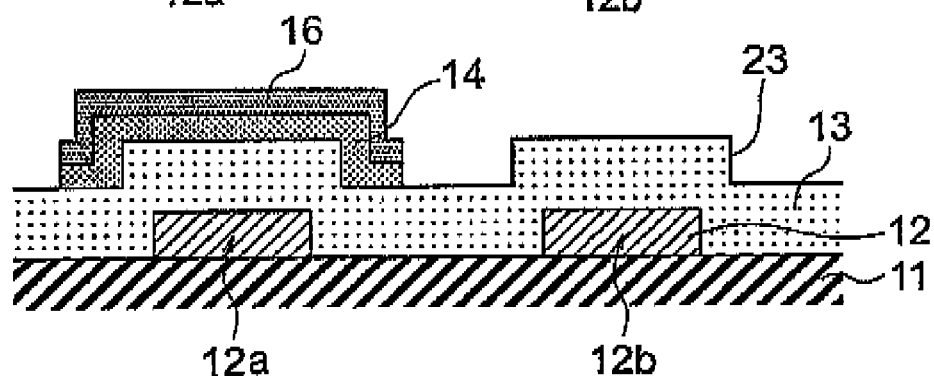
Figure 3C:
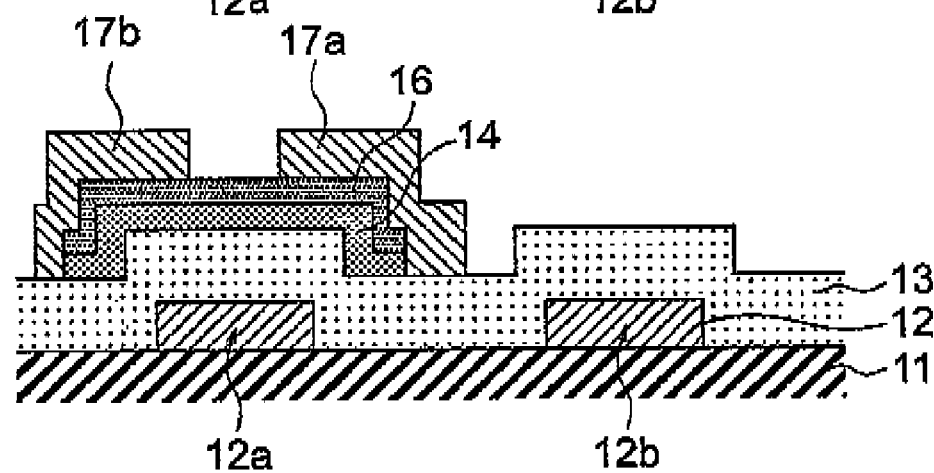

Subsequently, the intrinsic semiconductor layer 14 and ohmic contact layer 16 are subjected to patterning using a dry etching process, to configure a plurality of island regions isolated from one another (FIG. 3B). Thereafter, the source/drain electrode layer including a single Cr film or Mo/Al/Mo integrated films is deposited, and subjected to a wet etching or dry etching for patterning thereof to configure the source electrodes 17a, drain electrodes 17b, drain lines, and drain electrode terminals (FIG. 3C). In order to prevent formation of a leakage current path caused by etching residues of the conductive materials, the etching for patterning the conductive materials is performed until the entire surface of the gate insulating film 13 is exposed.

Figure 3D:
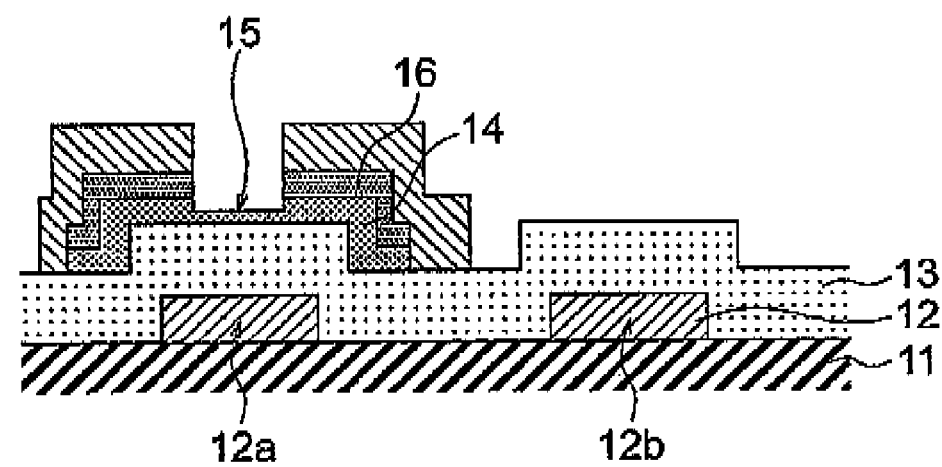
Figure 3E:
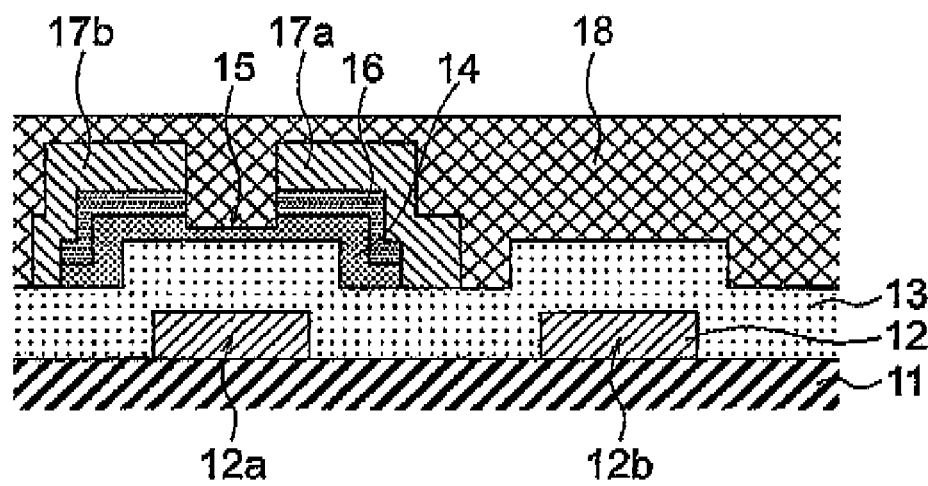
Figure 3F:
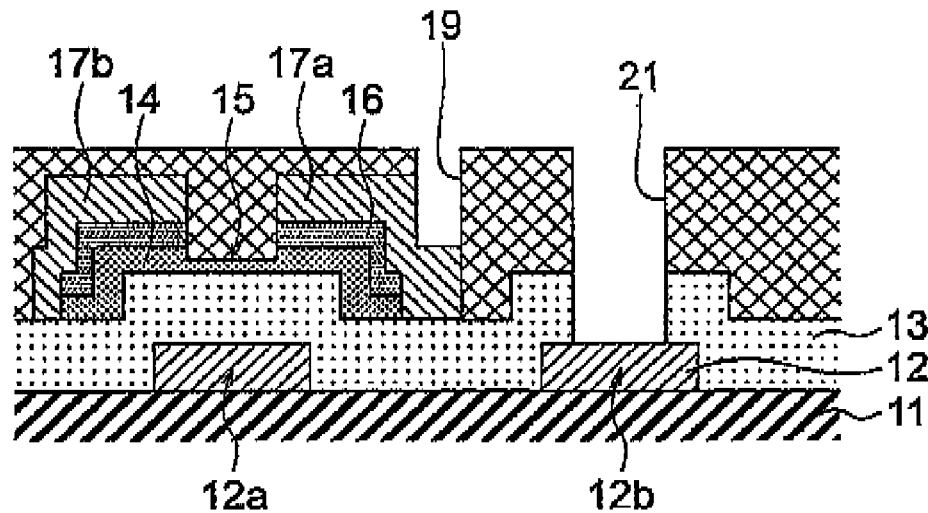

Subsequently, another etching is conducted to remove the ohmic contact layer 16 on the channel 15, and then a top portion of the intrinsic semiconductor layer 14 while controlling the etching time length, to thereby configure TFTs having a recessed channel (FIG. 3D). Thereafter, the protective layer 18, which includes SiNx and prevents contamination of the top of the channel 15, is deposited on the entire surface including the top of the channel 15 by using a plasma-enhanced CVD process (FIG. 3E). Subsequently, contact holes 19 and 21 are formed in the gate insulating film 13 and protective layer 18, to expose therethrough a top portion of the source electrodes 17a, gate electrode terminals 12b, and drain electrode terminals (FIG. 3F).

Thereafter, a transparent conductive film including ITO or IZO is deposited by sputtering within the contact holes 19 and 21, and on top of the protective layer 18. The transparent conductive film is then patterned to configure the pixel electrodes 20 connected to the source electrodes 17a, and external electrodes connected to the gate electrode terminals 12b and drain electrode terminals. Thus, the TFT substrate 10 shown in FIG. 1 is obtained.

It is generally considered that the increase in the OFF current of the TFTs caused by a thinner thickness of the gate insulating film 13 is due to an increase in the hole current within the intrinsic semiconductor layer 14. For this reason, it is also considered that a further smaller thickness of the gate insulating film 13 will result in a further increase in the hole current.

However, after performing a various evaluations such as investigations of the sectional structure of the TFTs and measurement of the electric characteristics thereof, the present inventor found the cause of the increase in the OFF current of the TFTs. The increase in the OFF current does not result from the increase in the hole current but mainly results from the etching residues of the conductive materials generated during the patterning of the intrinsic semiconductor layer 14, ohmic contact layer 16 and source/drain electrode layer, which in turn forms a leakage current path on the wafer between the drain lines 17c and the source electrodes 17a.

The present inventor also found that the etching residues of the conductive materials are generated in the case where the thickness of the gate insulating film 13 is equivalent to the thickness of the gate electrode layer 12 and it results to form a trap portion. In the conventional LCD unit, the thickness of the gate insulating film 13 is designed to be larger than the thickness of the gate electrode layer 12. However, the etching residues were generated in this conventional technique as well as in the above case where the thickness of the gate insulating film 13 is equivalent to the gate electrode layer 12. Thus, the present inventor found that generation of the etching residues, i.e., the increase in the OFF current of the TFTs can be avoided by employment of the configuration wherein the thickness of the gate insulating film is smaller than the thickness of the gate electrode film.

Figure 4A:
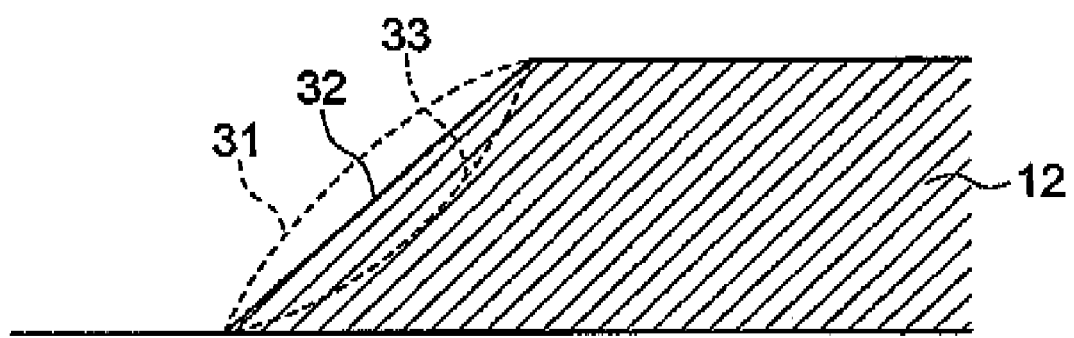
FIGS. 4A and 4B are cross-sectional views of a gate electrode in the TFT substrate at the step of FIG. 3A, for respective cases of the materials used for the gate electrode layer.
Figure 4B:
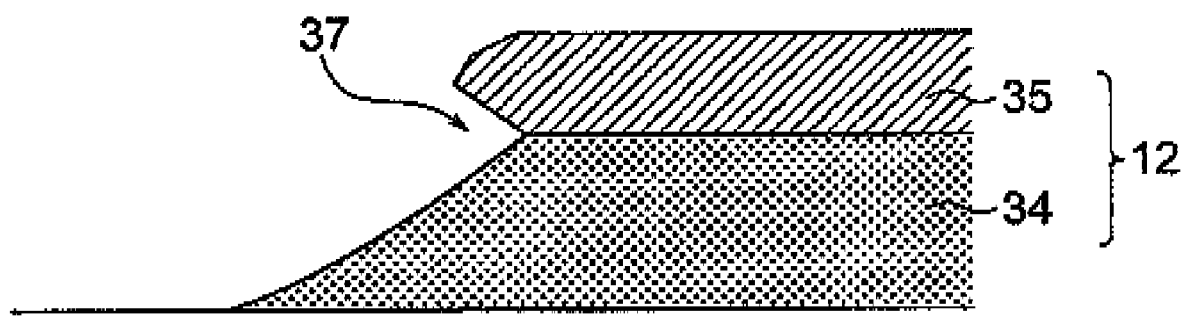

FIGS. 4A and 4B are cross-sectional views of the gate electrode or gate lines in the gate electrode layer 12 at the step of FIG. 3A. FIG. 4A shows a case where the gate electrode layer 12 is configured by a single Cr or Al film, whereas FIG. 4B shows another case where the gate electrode layer 12 is configured by a two-layer structure including Mo and Al films. A preferable structure of the gate electrode 12 is such that the bottom surface of the gate electrode 12 is larger than the top surface thereof due to the presence of a forward-tapered side surface, such as shown by numerals 31, 32, 33 in FIG. 4A. However, a wet etching process is likely to provide a local inverse-tapered structure on the side surface of the gate electrode 12.

For example, in the gate electrode layer 12 having the two-layer structure including Mo/Al films 34, 35 as shown in FIG. 4B, the battery function effect between both the metallic films 34, 35 causes an etch selectivity that etches the Al film 34 more rapidly than the Mo film 35. For this reason, the gate electrode layer 12 shown in FIG. 4B has an inverse-tapered structure 37 at a local position of the side surface of the gate electrode layer 12.

During the subsequent step of forming the gate insulating film 13 on the gate electrode 12 shown in FIG. 4B, a step portion 23 shown in FIG. 3B is formed due to reflection of the presence of the gate electrode 12, as described before. Since the plasma-enhanced CVD process used for depositing the gate insulating film 13 is an isotropic deposition process, the underlying gate electrode 12 may provide a forward-tapered structure to the overlying gate insulating film 13 even if the side surface thereof has the local inverse-tapered structure 37.

Figure 5A:
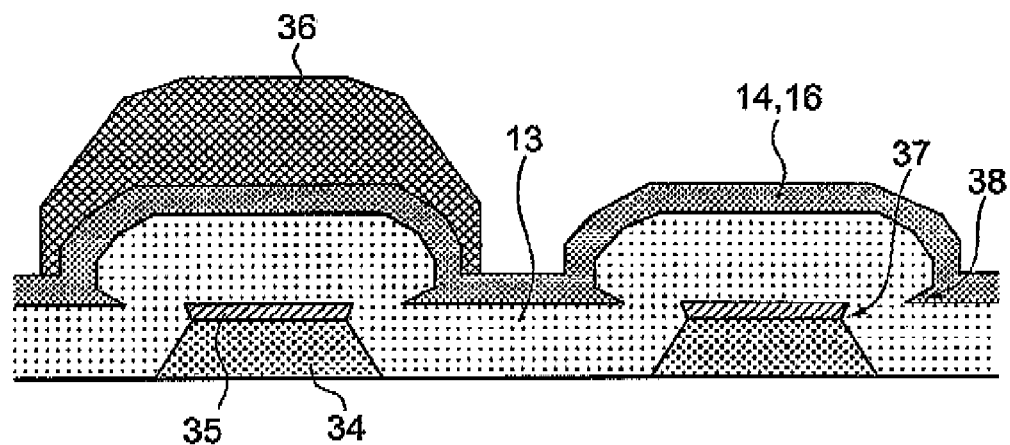
FIGS. 5A and 5B are sectional views showing the TFT substrate at the step of FIG. 3B, for a specific thickness of the gate insulating film.
Figure 5B:
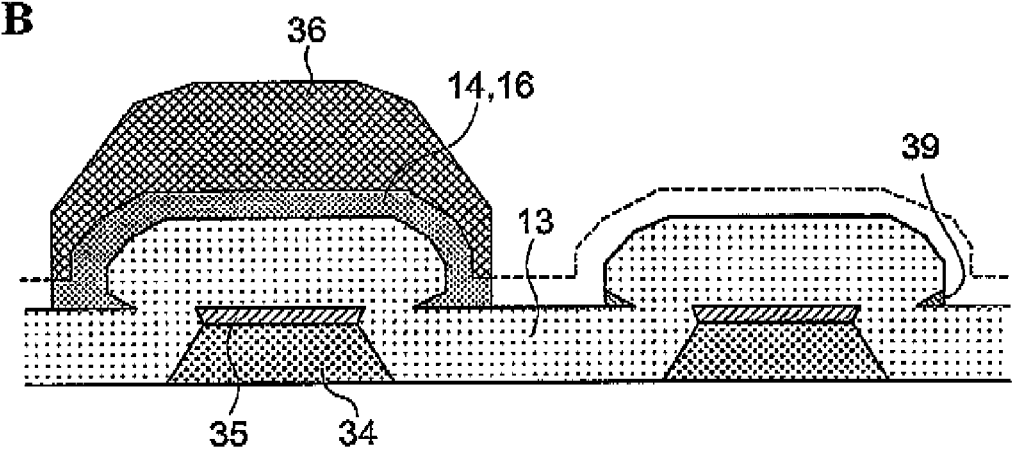

On the other hand, if the thickness of the gate insulating film 13 is designed to be equivalent to the thickness of gate electrode layer 12, as shown in FIG. 5A, a wedged depression 38 having an acute angle may be formed on the surface of the gate insulating film corresponding to the local inverse-tapered structure 37 of the gate electrode 12. The wedged depression 38 formed in the gate insulating film 13 may trap therein the etching residues 39 generated during etching of the conductive materials such as for patterning the intrinsic semiconductor layer 14, ohmic contact layer 16 and source/drain electrode layer, as shown in FIG. 5B. The trapped etching residues 39 may be left in the final product, to thereby form a leakage current path in the final product.

More specifically, the etching residues 39 may configure a leakage current path between the drain lines 17*c* (FIG. 2) and the source electrodes 17*a* (FIG. 1), to increase the OFF current of the TFTs. If the increase in the leakage current is relatively lower, the increased leakage current will cause a non-uniformity in the image of the LCD unit, whereas if the increase in the leakage current is relatively higher, the increase will cause point defects on the screen of the LCD unit.

Figure 6A:
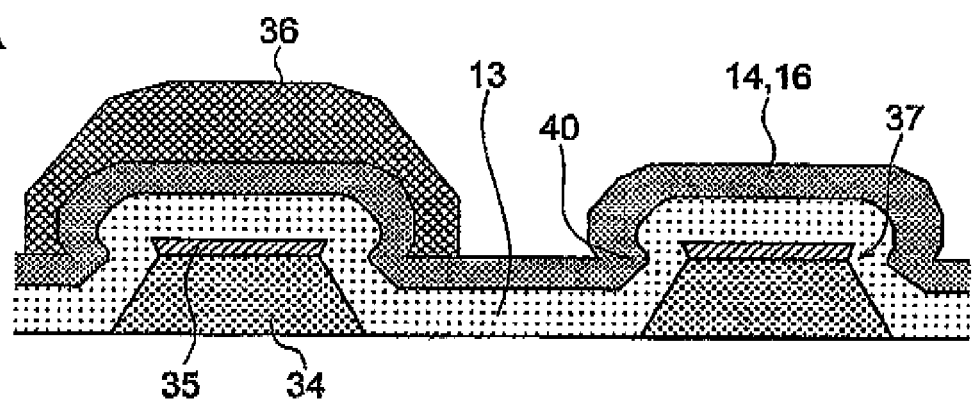
FIGS. 6A and 6B are sectional views showing the TFT substrate at the step of FIG. 3B, for another case of the thickness of the gate insulating film.

In the structure of the LCD unit of the present embodiment, the thickness of the gate insulating film 13 is thinner than the thickness of the gate electrode layer 12. This structure provides a smooth surface to the gate insulating film 13 along the side surface of the gate electrode layer 12. FIG. 6A shows the gate insulating film 13 in this case, wherein the gage insulating film 13 has an insignificant depression 40 on the surface thereof, instead of the wedged depression 38 having an acute angle as shown in FIGS. 5A and 5B.

Figure 6B:
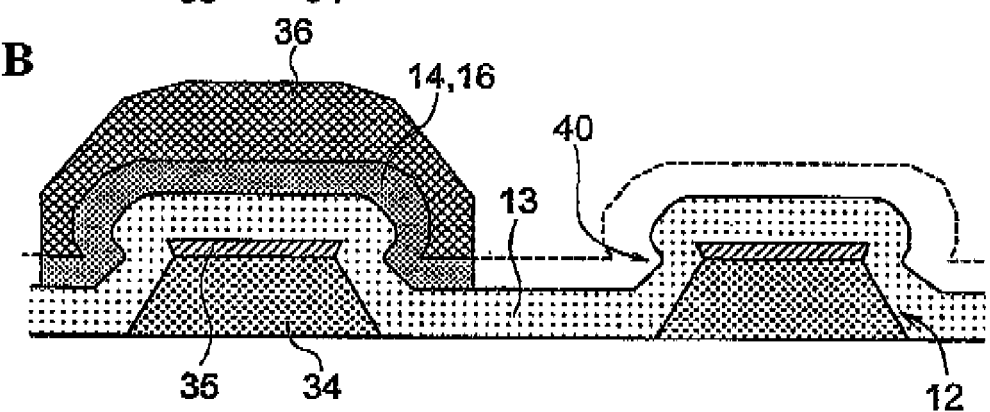

Accordingly, the present embodiment prevents generation of the etching residues in the vicinity of the gate electrode layer 12 after patterning the conductive materials such as for the intrinsic semiconductor layer 14, ohmic contact layer 16, and source/drain electrode layer, as shown in FIG. 6B. This prevents formation of the leakage current path between the drain lines 17*c* and the source electrodes 17*a*. Thus, the present embodiment achieves suppression of the increase in the OFF current of the TFTs, and reduction of the thickness of the gate insulating film 13, thereby increasing the ON/OFF ratio in the drain current of the TFTs.

Figure 7:
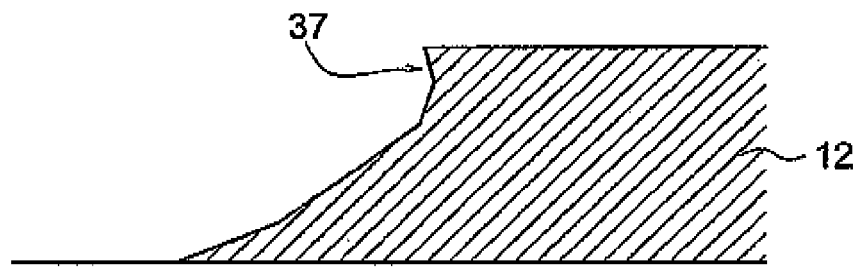
FIG. 7 is a sectional view showing a detail of the TFT substrate at the step of FIG. 3A, for a case where the gate electrode includes a single layer.

If the gate electrode layer 12 is configured by a single metallic film such as high-melting-point metal, Aluminum or Aluminum alloy, the patterning of the gate electrode layer 12 may sometimes generate a local inverted-tapered structure, such as shown in FIG. 7. This structure is generally caused by surface oxidation of the metallic film during patterning the metallic film by using the wet etching, and by the influence of the adhesion force of the resist film with respect to the metallic layer. In such a case, i.e., if the gate electrode layer 12 has a local inverse-tapered structure, the configuration wherein the thickness of the gate insulating film 13 is thinner than the thickness of the gate electrode layer 12 provides a similar advantage irrespective of whether the gate electrode layer 12 is made of Mo/Al/Mo films or a single Cr film.

It may be considered to intentionally reduce the gate electrode layer 12 in order for suppressing the increase in the OFF current of the TFTs and reducing the thickness of the gate insulating film 13. However, a thinner thickness of the gate electrode layer 12 increases the line resistance of the gate lines, common lines, etc. that configure the gate electrode layer 12, to thereby increase the undesirable signal delay.

The configuration of the present embodiment is such that the thickness of the gate insulating film 13 is thinner than the thickness of the gate electrode layer 12, to suppress the increase in the OFF current of the TFTs. In this configuration, the thickness of the gate electrode layer 12 is not subjected to restriction caused by the reduction of the gate insulating film 13, whereby the thickness of the gate electrode layer 12 may have an optimum thickness to assure a lower line resistance thereof and an improved characteristic for the TFT substrate 10.

Figure 8:
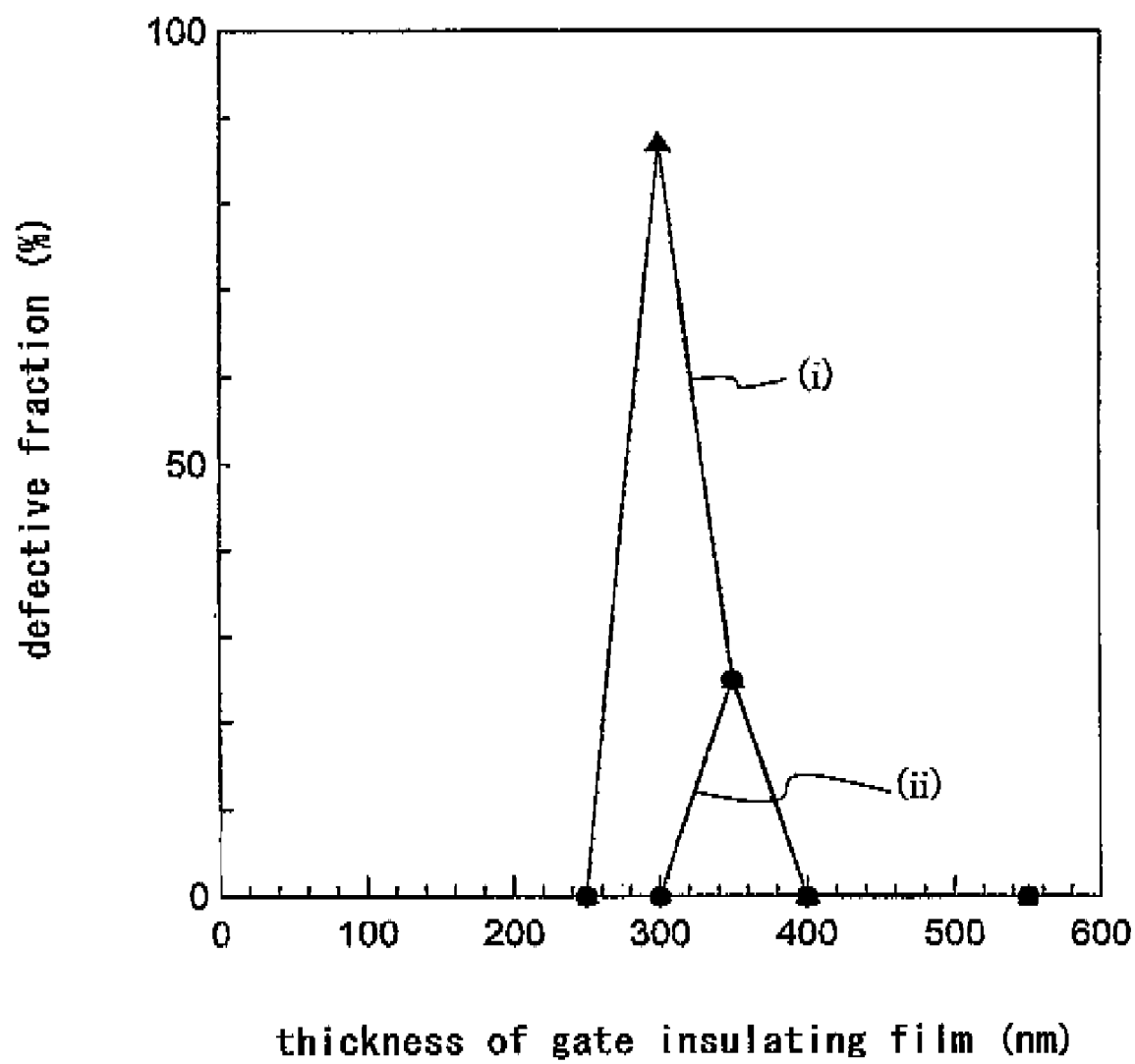
FIG. 8 is a graph showing the relationship between the defective fraction of the product LCD units and the thickness of the gate insulating film.

In order to assure advantages of the present invention, the characteristic of the LCD unit is investigated for a variety of thickness of the gate insulating film 13. FIG. 8 shows results of the investigation in a graph wherein the defective fraction of the products, i.e., the ratio of number of defective products having unevenness on the screen to the total number of products is plotted for a variety of thickness of the gate insulating film. The curve (i) represented by triangular dots shows the case where the gate electrode layer 12 of 270 nm included a 70 nm Mo film and a 200 nm Al film in thick, whereas the curve (ii) represented by circular dots shows the case where the gate electrode layer 12 of 370 nm included a 70 nm Mo film and a 300 nm Al film in thick. The thickness of the gate insulating film 13 is varied from 250 nm to 550 nm. The thicknesses for the gate electrode layer, Mo film, Al film and gate insulating film as recited herein are optimum thicknesses or target thicknesses.

As understood from FIG. 8, if the thickness of the gate insulating film 13 is equivalent or more to the thickness of the gate electrode layer 12, the defective fraction, i.e., ratio of the defective products to the total products markedly increases. In addition, the defective fraction is lowered for the case where the thickness of the gate insulating film 13 is larger than the thickness of the gate electrode layer 12 as well as the case where the thickness of the gate insulating film 13 is thinner than the thickness of the gate electrode layer 12. This phenomenon cannot be clarified by the general theory that a thinner thickness of the gate insulating film increases the hole current, which in turn increase the OFF current of the TFTs. That is, this phenomenon may be a proof that a thickness of the gate insulating film which is equivalent to the thickness of the gate electrode layer increases the etching residues, which in turn increases the OFF current of the TFTs.

In the example of the FIG. 8, the configuration wherein the thickness of the gate insulating film 13 is below the thickness of the Al film suppressed the increase in the OFF current caused by the etching residues of the conductive materials. Thus, it is preferable in the present embodiment that, for the case of gate electrode layer 12 including a 70 nm Mo film and a 200 nm Al film in thick shown by curve (i), the thickness of the gate insulating film 13 be set at 200 nm or less, and for the case of gate electrode layer 12 including a 70 nm Mo film and a 300 nm Al film shown by curve (ii), the thickness of the gate insulating film 13 be set at 300 nm or less.

It was assured in the present invention that for a thickness of the gate electrode layer 12 which is 200 nm or above, the thickness of the gate insulating film 13 is preferably thinner than the thickness of the gate electrode layer 12 by 50 nm or above for achieving suppression of the etching residues of the conductor material. It is preferable that the thickness of the gate insulating film be 150 nm or above, in order to prevent destruction of the TFTs caused by an electrostatic discharge during fabrication of the TFTs. It is also preferable that the gate insulating film have a thickness which is about 200 nm or above, in order to suppress the leakage current and maintain a desired withstand voltage of the gate insulating film 13.

Although the fabrication process described with reference to FIGS. 3A to 3F is a so-called five-mask process, the fabrication process may be a four-mask process as well, wherein the steps shown in FIGS. 3B and 3C use a common photoresist mask, for achieving a similar advantage. Although the fabrication process described above provided TFTs having a recessed channel structure by controlling the etching time length during removal of the top portion of the intrinsic semiconductor layer, the structure of the TFTs is not limited to the recessed channel structure. For example, channel-protected TFTs may be formed by providing an etch stop layer between the intrinsic semiconductor layer 14 and the ohmic contact layer 16, to prevent etching of the intrinsic semiconductor layer 14. The LCD unit may be driven by any of the longitudinal-electric-field drive scheme and the lateral-electric-field drive scheme.

The TFTs in the above embodiment are of an inverse-staggered type, wherein the gate electrode 12a underlies the gate insulating film 13. However, the TFTs may be of a forward-staggered type, wherein the source/drain electrode layer, ohmic contact layer 16, and intrinsic semiconductor layer 14 underlie the gate insulating film 13, and the gate electrode 12a overlies the gate insulating film 13. In this case, the gate insulating film 13 may have a step portion thereon due to the pattern of the source/drain electrode layer, ohmic contact layer 16 and intrinsic semiconductor layer 14. However, a thickness of the gate insulating film 13 which is thinner than the total thickness of the source/drain electrode layer, ohmic contact layer 16 and intrinsic semiconductor layer 14 prevents generation of the etching residues after patterning the gate electrode 12a thereby preventing the leakage current path from being formed between the gate lines.

It is to be noted that a thickness of the gate insulating film 13 which is smaller than the thickness of the gate electrode layer 12 may cause a steep step portion formed on the gate insulating film 13 in the vicinity of the gate electrode layer 12. The steep step portion may cause a disconnection of the drain lines formed on the gate insulating film in the vicinity of the steep step portion thereof. As the countermeasure of this problem, a pattern of the intrinsic semiconductor layer 14 and ohmic contact layer 16 may be left at the intersection of the gate lines and drain lines and interposed therebetween. In an alternative, a larger thickness of the source/drain electrode layer may be employed.

While the invention has been particularly shown and described with reference to the exemplary embodiment and modifications thereof, the invention is not limited to these embodiment and modifications. It will be understood by those of ordinary skill in the art that various changes in form and details may be made therein without departing from the spirit and scope of the present invention as defined in the claims.

What is claimed is:

1. An active-matrix-drive display unit having a thin film transistor comprising:
   the thin film transistor that is an inversely-staggered type, and that includes a gate electrode layer, a gate insulating film, source/drain electrode layers, and a patterned semiconductor layer formed by etching across the source/drain electrode layers, which are configured in association with one another on an insulating substrate, said gate insulating film having a thickness less than a thickness of said gate electrode layer,
   wherein a portion of a side surface of said gate electrode layer has a constricted structure so that a top portion of said gate electrode layer overhangs a bottom portion of said gate electrode layer providing a smooth surface to the gate insulating film along the side surface of the gate electrode layer preventing formation of a leakage current path between a drain electrode and a source electrode.

2. The active-matrix-drive display unit according to claim 1, wherein said gate insulating film is interposed between interconnection lines of said gate electrode layer and interconnection lines of said source/drain electrode layer at an intersection therebetween.

3. The active-matrix-drive display unit according to claim 1, wherein said gate electrode layer includes a plurality of metallic films.

4. The active-matrix-drive display unit according to claim 3, wherein said plurality of metallic films include a first metallic film and a second metallic film overlying said first metallic film, and the thickness of said gate insulating film is equal to or less than a thickness of said first metallic film.

5. The active-matrix-drive display unit according to claim, 1, wherein the thickness of said gate electrode layer is 200 nm or more, and the thickness of said gate insulating film is less than the thickness of said gate electrode layer by 50 nm or more.

* * * * *